United States Patent [19]
Ueda et al.

[11] Patent Number: 5,592,019
[45] Date of Patent: Jan. 7, 1997

[54] SEMICONDUCTOR DEVICE AND MODULE

[75] Inventors: Tetsuya Ueda; Kisamitsu Ono; Kou Shimomura; Hideyuki Ichiyama, all of Kikuchi-gun, Japan

[73] Assignee: Mitsubishi Denki Kabushiki Kaisha, Tokyo, Japan

[21] Appl. No.: 416,196

[22] Filed: Apr. 4, 1995

[30] Foreign Application Priority Data

Apr. 19, 1994 [JP] Japan ................................. 6-080616

[51] Int. Cl.⁶ .................................................. H01L 23/495
[52] U.S. Cl. ............................ 257/666; 257/675; 257/676
[58] Field of Search ................................. 257/666, 676, 257/660, 675, 669, 667

[56] References Cited

U.S. PATENT DOCUMENTS

| | | | |
|---|---|---|---|
| 4,796,078 | 1/1989 | Phelps, Jr. et al. | 257/660 |
| 5,047,837 | 9/1991 | Kitano et al. | 257/675 |
| 5,172,214 | 12/1992 | Casto | 257/667 |
| 5,365,106 | 11/1994 | Watanabe | 257/669 |

FOREIGN PATENT DOCUMENTS

| | | | |
|---|---|---|---|
| 0550013 | 7/1993 | European Pat. Off. | |
| 2211643 | 8/1980 | Japan . | |
| 60-180154 | 2/1984 | Japan . | |
| 198744 | 11/1984 | Japan | 257/666.2 |
| 6366954 | 9/1986 | Japan . | |
| 6366959 | 9/1986 | Japan . | |
| 62-266855 | 11/1987 | Japan . | |
| 2110960 | 4/1988 | Japan . | |
| 63-151057 | 6/1988 | Japan . | |
| 316250 | 6/1989 | Japan . | |
| 1206660 | 8/1989 | Japan . | |
| 3129866 | 10/1989 | Japan . | |
| 2-97049 | 4/1990 | Japan | 257/666.2 |
| 2270361 | 11/1990 | Japan . | |
| 2310954 | 12/1990 | Japan . | |
| 521684 | 7/1991 | Japan . | |
| 3194954 | 8/1991 | Japan . | |
| 555273 | 8/1991 | Japan . | |
| 3270062 | 12/1991 | Japan . | |
| 414859 | 1/1992 | Japan . | |
| 4-99044 | 3/1992 | Japan | 257/666.2 |
| 4206559 | 7/1992 | Japan . | |
| 4237154 | 8/1992 | Japan . | |
| 529525 | 2/1993 | Japan . | |
| 5152495 | 6/1993 | Japan . | |
| 653399 | 2/1994 | Japan . | |
| 661408 | 3/1994 | Japan . | |
| 697358 | 4/1994 | Japan . | |

OTHER PUBLICATIONS

Winkler et al., "Dense Packaging For High Speed Cache Memory (Fast Static RAM) And Main Memory (DRAM)", Motorola Inc. Technical Developments, vol. 18, Mar. 1993, pp. 28–31.

Nekki Electronics (No. 4) published Sep. 7, 1987, pp. 99–107.

*Primary Examiner*—William Mintel
*Assistant Examiner*—Roy Potter
*Attorney, Agent, or Firm*—Leydig, Voit & Mayer

[57] ABSTRACT

A semiconductor device in a vertical surface mount package, reduced in size and having a higher heat radiating capacity, a method of producing the semiconductor device, and a semiconductor module. Leads of a first lead frame and leads of a second lead frame are parallel to each other and at least a portion of the leads overlap leads of the other lead frame when geometrically projected on them. An inner lead may extend out from the semiconductor package or the back side of a die pad in the semiconductor package may be exposed. The invention allows more outer leads to be used and makes it possible to reduce the size of the semiconductor device and to achieve high density mounting.

12 Claims, 17 Drawing Sheets

A

SEMICONDUCTOR DEVICE AND MODULE

BACKGROUND OF THE INVENTION

1. Field of the Invention

The invention relates to a semiconductor device and a method of producing the same, and a semiconductor module, and, more particularly, to reduction in size and improvement in heat radiating capacity of a vertical-type surface mount package, as well as a semiconductor module employing a semiconductor package.

2. Description of the Related Art

A description will be given of a prior art, which serves as the background of the invention, with reference to FIGS. 20 through 30. Referring to FIGS. 20 through 30, reference numeral 1 denotes a semiconductor device; reference numeral 4 denotes a semiconductor chip; reference numeral 6 denotes a die pad; reference numeral 7 denotes a sealing resin; and reference numeral 8 denotes an inner lead. Referring to the same figures, reference numeral 10 denotes an outer lead forming a first lead frame, which extends out from the sealed portion of the lead of the first frame; reference numeral 11 denotes an outer lead of a second lead frame, which extends out from the sealed portion of the lead of the second frame; reference numeral 16 denotes a suspension lead for die pad 6, which connects die pad 6 and an outer portion of a lead frame; reference numeral 24 denotes an outer lead on a lead frame; reference numeral 25 denotes a stand lead, which is longer than the usual outer leads and is bent in the same and opposite directions with respect to the usual leads, for setting upright semiconductor 1 in a conventional SVP package (described later); and reference number 26 denotes a lead frame.

Hitherto, there has been provided a vertical mount package called, "Zigzag In-line Package" (ZIP), shown in FIGS. 20 and 21, for packaging a semiconductor device. In a ZIP, a semiconductor device is set perpendicular to a mounting substrate and mounted thereon. This has allowed it to respond, in particular, to demands such as for higher density mounting (higher mounting density per mounting area), for example, in the memory IC field. [Refer to pp. 99 through 107 of Nikkei Electronics (No. 4), published on Sep. 7, 1987.]

The aforementioned ZIP-type semiconductor device (ZIP) is a so-called through hole device (THD) in which an external lead is soldered by inserting it into a through hole. Besides the aforementioned ZIP, dual in-line package (DIP) type semiconductor devices are also available as a type of THD (shown in FIG. 22), which has been employed as a main package for semiconductor devices.

However, since, in THD, a semiconductor device is mounted by using a through hole in the substrate, only one face of the substrate can be used for mounting. For this reason, with increased demands for higher density mounting, the so-called surface mount device (SMD), which allows mounting on both faces of the substrate, is beginning to replace the THD. Mounting on both faces is achieved by placing the external lead on an electrode (land), disposed on the surface of the substrate, and soldering it thereto.

Although available SMD types include, for example, small out-line package (SOP) semiconductor devices, shown in FIG. 23, and small out-line J-lead (SOJ) semiconductor devices, no ZIP-type semiconductor packages (aforementioned vertical-type surface mount package) exist as standard packages. Accordingly, various companies have proposed various ideas, which include those disclosed, for example, in Japanese Patent Laid-Open No. 2-110960, Japanese Patent Laid-Open No. 3-129866, Japanese Patent Laid-Open No. 3-194954, Japanese Patent Laid-Open No. 5-21684, and Japanese Patent Laid-Open No. 5-55273.

The surface vertical package (SVP), shown in FIGS. 24, 25, and 26, is being considered as a standardized package. However, since in an SVP the external leads are formed on one frame, the use of a larger number of leads results in a package length (length of the side where the leads extend out) which is longer than that required with respect to the chip size. Therefore, in some cases it is not possible to take advantage of the high-density mounting of the vertical-type surface mount package. Likewise, in the semiconductor device packages disclosed in Japanese Patent Laid-Open No. 2-110960, Japanese Patent Laid-Open No. 3-129866, and Japanese Patent Laid-Open No. 3-194954, when a large number of outer leads need to be used, it is necessary to extend the length of the side where the external leads extend out from the package. This has prevented such semiconductors from meeting the demand of high-density mounting.

Ideas have been proposed to overcome such a problem, for example, in Japanese Patent Laid-Open No. 60-180154, Japanese Patent Laid-Open No. 63-66959, and Japanese Patent Laid-Open No. 5-21684, in which when a large number of outer leads are required, the length of the side where the outer leads extend out is reduced by one-half by forming the leads into multiple layers.

Among these publications, Japanese Patent Laid-Open No. 60-180154 and Japanese Patent Laid-Open No. 63-66954 disclose semiconductor packages in which two lead frames are bonded together through a dielectric layer. However, since care must be taken in mounting the electrodes at the substrate side and the semiconductor device is a through hole type device, it is difficult to achieve surface mounting.

Even in the semiconductor package disclosed in Japanese Patent Laid-Open No. 5-21684, extreme care must be taken to carry out mounting at the substrate side, thus preventing it from being used widely. In addition, since the tape automated bonding (TAB) technique is used to mount the semiconductor, it is difficult to simultaneously mount other semiconductor parts during the mounting process. In the semiconductor packages disclosed in the aforementioned Japanese Patent Laid-Open No. 60-180154, Japanese Patent Laid-Open No. 63-66959, and Japanese Patent Laid-Open No. 5-21684, two types of outer leads are bonded together through a dielectric layer and bent in the same direction. Therefore, the thickness of the leads where they are bent is virtually doubled, and there is a difference in curvature R between the two types of outer leads in the bending process, so that the leads are displaced with respect to each other. For this reason, it is difficult to process the leads, and in some cases, dielectric breakdown may occur in the dielectric layer between the leads.

An idea is disclosed in Japanese Patent Laid-Open No. 3-16250 to allow a large number of outer leads required to be used as described above. In this publication, two lead frames are used, with an outer lead of a second lead frame placed between the outer leads of a first lead frame. In this example, as illustrated in FIGS. 27 and 28, a smaller distance between the outer leads results in a smaller width of outer leads 11 (or 10) of the second (or first) lead frame, which are disposed between outer leads 10 (or 11) of the first (or second) lead frame, so that in some cases sufficient lead strength cannot be retained. On the other hand, when outer leads 10 and 11 are made thicker in width to obtain the necessary lead strength, the distance between the leads becomes larger, which results in a larger package size.

FIG. 29 illustrates a conventional package size. The figure shows a plan view of lead frame 26 after chip 4 has been bonded onto die pad 6 for the purpose of showing that the outer leads of the package which extend out are larger than the chip in size.

Such semiconductor devices described above, which have a vertical-type structure, have the problem that effective use cannot be made of the part of the die pad 6, to which the chip is bonded, which is disposed with respect to the suspension lead and adjacent to the D portion (in FIG. 29), the D portion being disposed adjacent to the chip and opposite to the outer leads 24. In particular, as illustrated in FIG. 30, when the chip occupies a larger area with respect to the package and the mounting density is high, there is the problem that the electrodes (bonding pads) on the chip, which is connected with the outer leads, are disposed on only one side of the chip.

SUMMARY OF THE INVENTION

In view of the above-described problems, the invention is aimed at providing a semiconductor device in which the number of leads can be increased without widening the distance between the leads, and reduction in package size and higher density mounting can be achieved, a method of producing the same, and a semiconductor module.

To these ends, according to one aspect of the invention, there is provided a semiconductor device with two lead frames, including a semiconductor chip embedded in resin, wherein outer leads forming a part of a first lead frame are disposed parallel to and not on the same plane as outer leads forming a part of a second lead frame, and wherein when both of the aforementioned outer leads extend outward in respective planes they are disposed such that the outer leads of the first lead frame overlap at least portions of the outer leads of the second lead frame.

The invention also provides a semiconductor device having two lead frames, with a semiconductor chip embedded in a resin, wherein a lead of a first lead frame extends out from the main face of the semiconductor device, and an outer lead of a second lead frame extends out from a side of the semiconductor device.

According to another aspect of the invention, there is provided a semiconductor module including of a substrate and a plurality of semiconductor devices, wherein outer leads, which are arranged in two rows and extend out almost parallel to one another from a side of the semiconductor device, nip the substrate, so that the semiconductor device is mounted to the substrate almost on the same plane.

The invention also provides a semiconductor module including a substrate and a plurality of semiconductor devices, wherein the semiconductor devices are arranged parallel to one another on a side of the substrate connected to the mother board and at least on one face of the substrate.

The invention also provides a semiconductor module including a substrate and a plurality of semiconductor devices, wherein the semiconductor devices are mounted vertically to a side of the substrate connected to the mother board and at least on one face of the substrate.

According to still another aspect of the invention, there is provided a method of producing a semiconductor device with two lead frames, a semiconductor chip mounted on a die pad and sealed in resin, wherein a die is nipped between an outer lead of a first lead frame and an outer lead of a second lead frame for resin sealing between an upper die and a lower die.

The invention also provides a method of producing a semiconductor device with two lead frames, a semiconductor chip mounted on a die pad and sealed in resin, wherein the two lead frames and the die pad having mounted thereon the semiconductor chip are placed at the lower die, a block member is inserted between the outer leads of the two lead frames, and the upper die is fitted onto the lower die to carry out resin sealing.

DESCRIPTION OF THE PREFERRED EMBODIMENTS

First Embodiment

Figure 1:
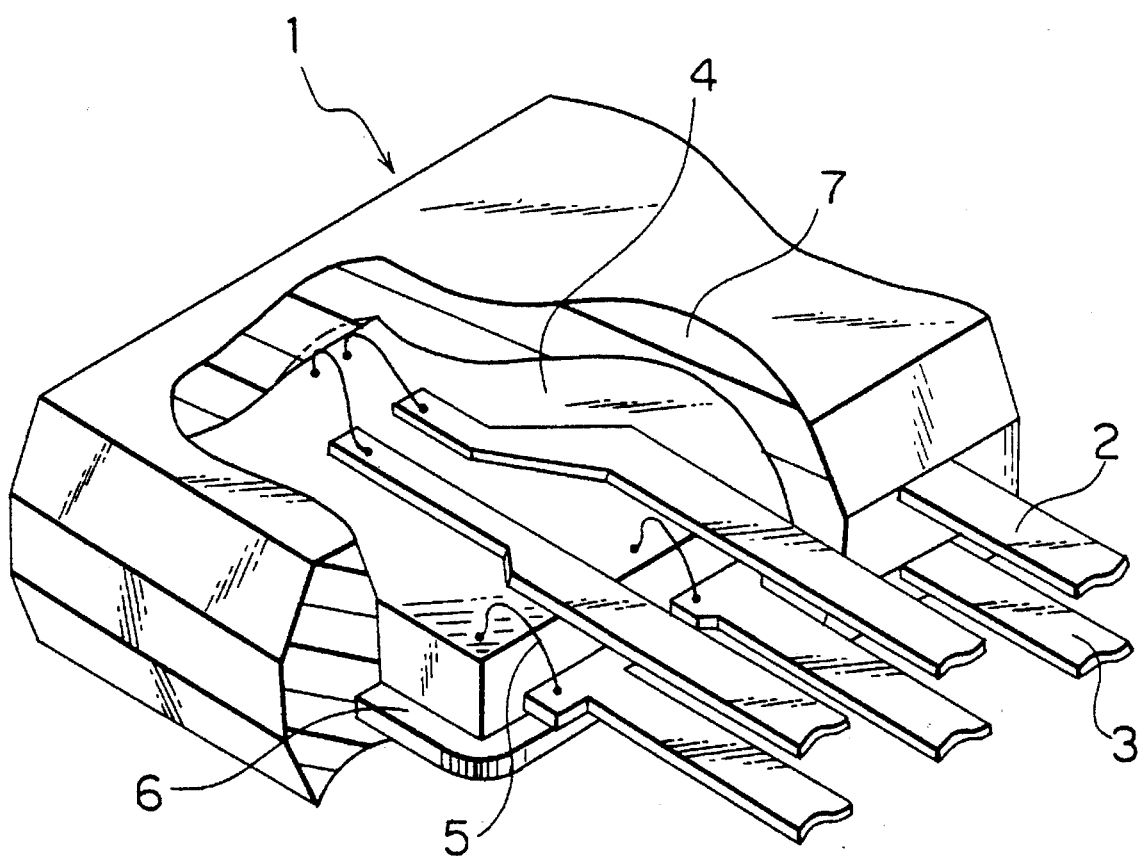
FIG. 1 is a partially cutaway perspective view of a semiconductor device according to a first embodiment of the invention.
Figure 2:
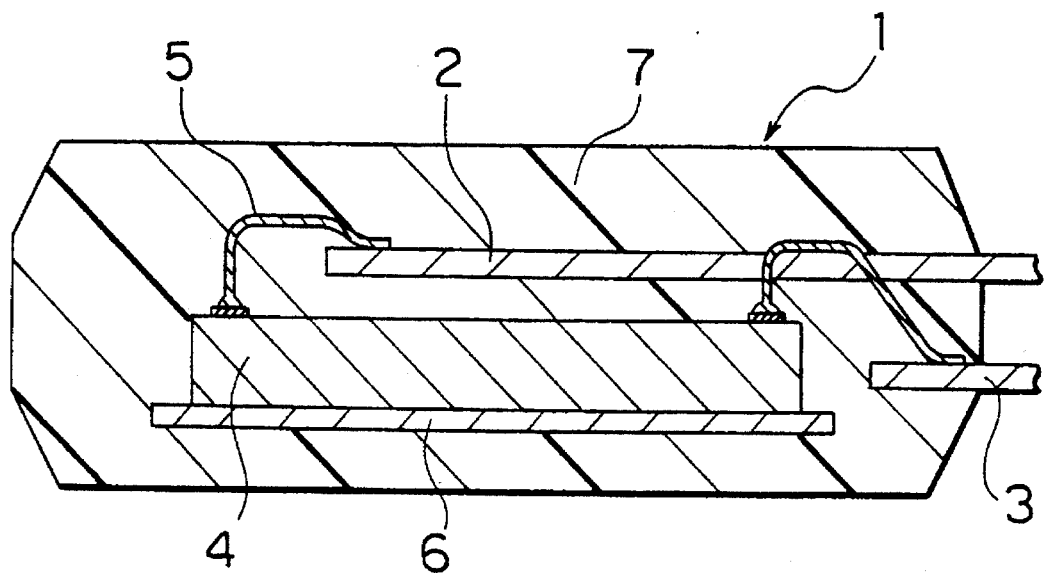
FIG. 2 is a side cross sectional view of the semiconductor device illustrated in FIG. 1.

A description will be given of a semiconductor device embodying the invention with reference to FIGS. 1 through 5. FIG. 1 is a partially cutaway perspective view of a semiconductor device according to a first embodiment of the invention, while FIG. 2 is a side cross sectional view of the device of FIG. 1. In the same figures, the same or corresponding parts are given the same reference numerals. Reference numeral 1 denotes a semiconductor device; reference numeral 2 denotes a lead forming a part of a first lead frame; reference numeral 3 denotes a lead forming a part of a second lead frame; reference numeral 4 denotes a semiconductor chip; reference numeral 5 denotes a thin metal wire for electrically connecting the semiconductor chip 4 to lead 2 or lead 3; reference numeral 6 denotes a die pad for fixing the semiconductor chip, formed at a side of the first lead frame or the second lead frame; and reference numeral 7 denotes a resin that protects the semiconductor chip 4 from the outside environment.

In the semiconductor device having the above-described construction, when the set of leads (outer lead) 2, forming a part of the first lead frame, and the set of leads (outer lead) 3, forming a part of the second frame, have been projected on the plane, they are disposed such that a portion of leads 2 overlap leads 3. Accordingly, the number of outer leads which extend out from a side of the semiconductor device (semiconductor package) can be doubled without increasing the distance between leads 2, forming a part of the first lead frame, or lead 3, forming a part of the second lead frame. This makes possible a reduction in package size in a multi-pin integrated circuit; that is, high density mounting is made possible.

In the semiconductor device of FIGS. 1 and 2, the inner leads, forming a part of the first lead frame, extend on the functional surface of the semiconductor chip 4, and are electrically connected to electrodes on the semiconductor chip, provided at the side opposite where leads 2 and 3 extend out. The inner leads, forming a portion of the second lead frame, are electrically connected to the electrodes 4 on the semiconductor chip 4, provided at the side where leads 2 and 3 extend out.

Figure 28:
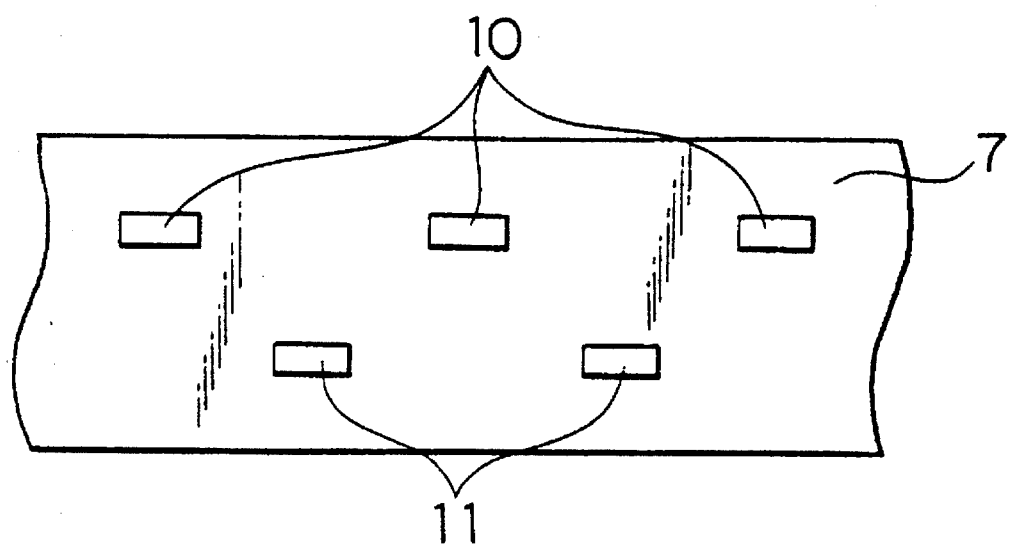
FIG. 28 is a bottom view of a package which utilizes the conventional two-row outer lead arrangement.
Figure 29:
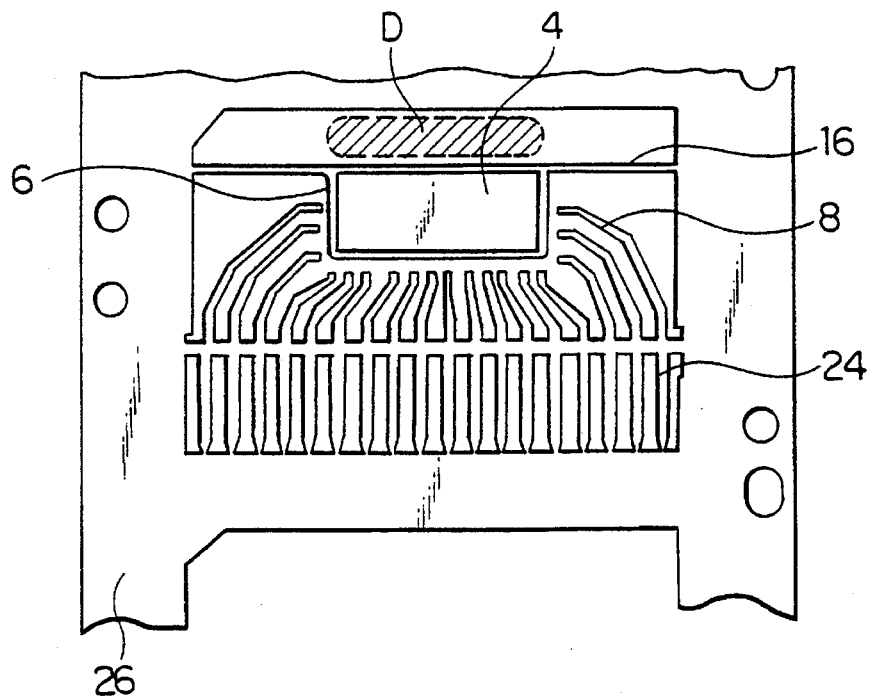
FIG. 29 is a partial plan view of a lead frame for a conventional ZIP package.
Figure 30:
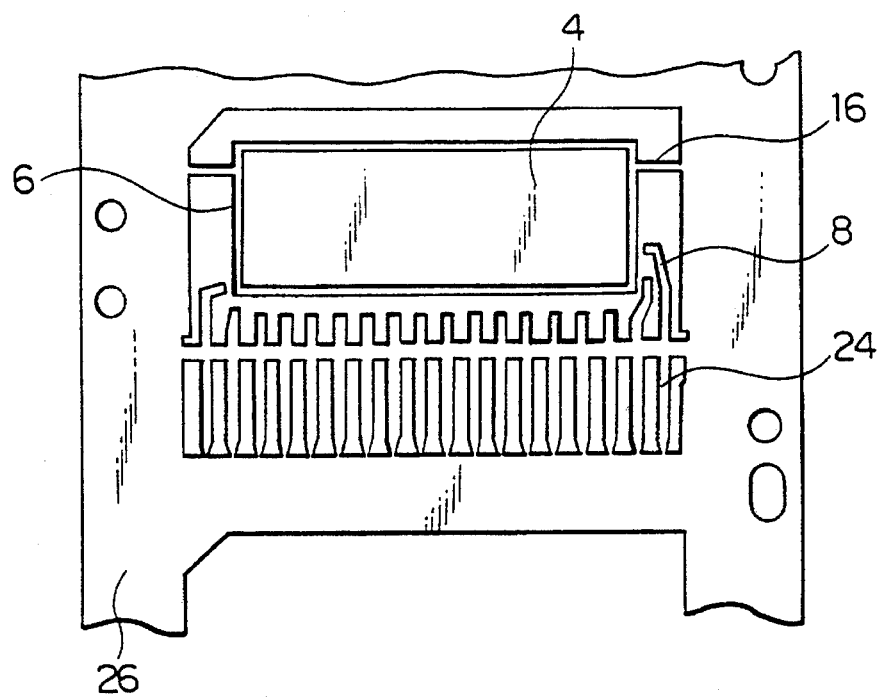
FIG. 30 is a partial plan view of another lead frame for the conventional ZIP package.

This overcomes the problem in the prior art, illustrated in FIGS. 28 and 29, that the die pad extends above a side of the semiconductor chip, which limits the way the semiconductor chip can be designed. Therefore, it is not necessary to lengthen the thin metal wire 5, or Al wiring, on the semiconductor chip. In some cases this may be effective in producing a high-speed semiconductor device.

Figure 3:
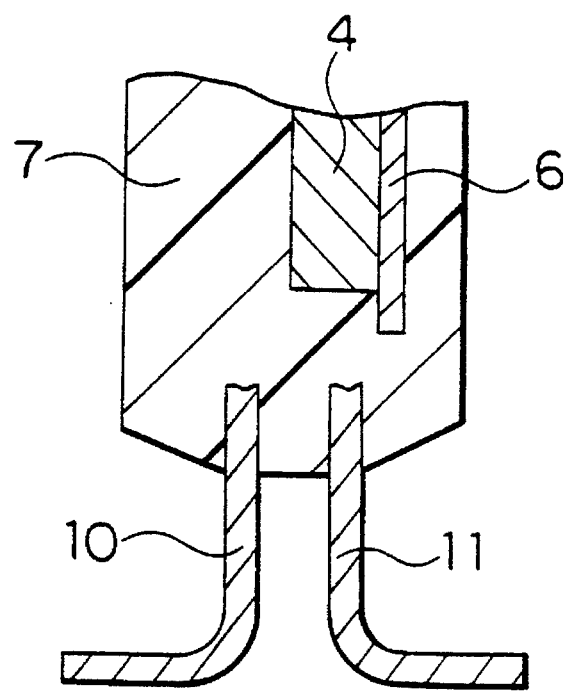
FIG. 3 is a partial side cross sectional view of a semiconductor device according to the first embodiment of the invention whose outer leads are bent at their front ends.

In the semiconductor device of FIGS. 1 and 2, as shown in FIG. 3, outer lead 10 of the first lead frame (the outer lead extending out from sealing resin 7 embedding lead 2, with lead 2 forming a part of the first lead frame) and the outer lead 11 of the second lead frame (the outer lead extending out from sealing resin 7 embedding lead 3, with lead 3 forming a part of the second lead frame) are bent in opposite directions almost perpendicular, at an angle of about 80° to 90°. Soldering the outer leads 10 and 11 onto a substrate by putting them on an electrode (land) allows mounting of the semiconductor 1 to the substrate.

Figure 4:
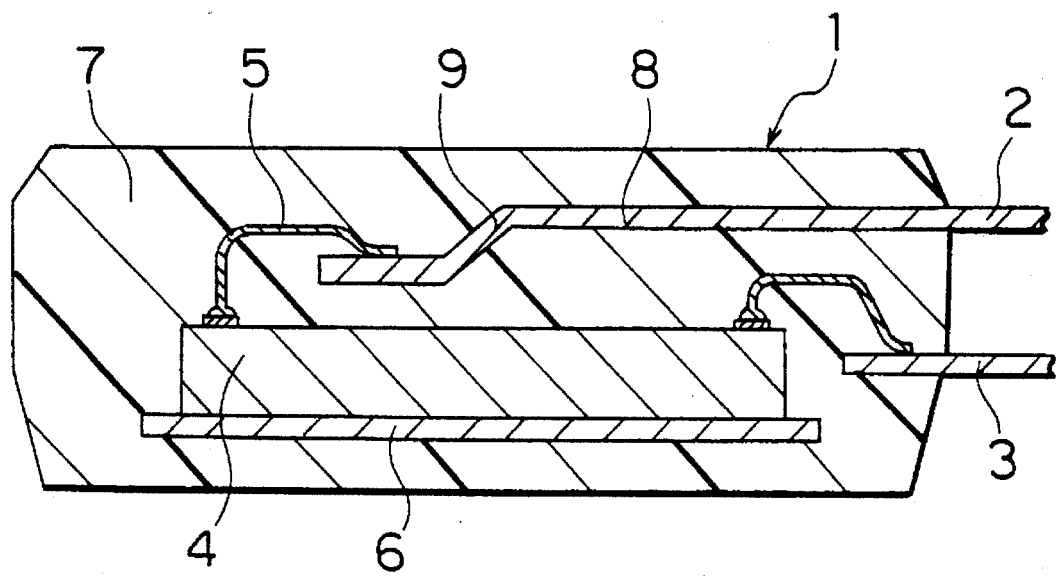
FIG. 4 is a side cross sectional view of a semiconductor device according to the first embodiment with the front ends of the inner leads embedded therein.

In the aforementioned first embodiment, the distance between lead 2 which forms a part of the first lead frame and lead 3 which forms a part of the second lead frame is small, so that the thin metal wire 5 (which electrically connects lead 3 and semiconductor chip 4) and lead 2 may be shorted. One way to avoid such a problem is to design leads 2 and 3 in a way which does not cause short the lead and wire. For example, as shown in FIG. 4, lead 2, forming a part of the first lead frame, and lead 3, forming a part of the second lead frame, are separated a greater distance, while the front end of the inner lead 8 of lead 2 is bent downward to form a sunk portion 9 to bring bonding portion of the thin metal wire 5 on the lead 2 closer to the semiconductor chip 4.

Figure 5:
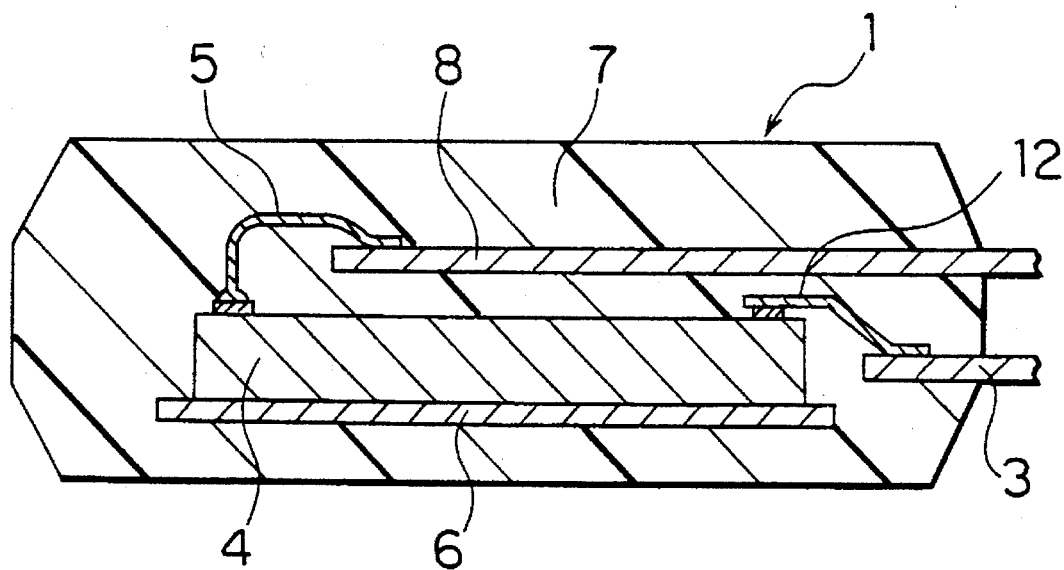
FIG. 5 is a side cross sectional view of a semiconductor device according to the first embodiment with a TAB lead.

In place of thin metal wire 5 which may be shorted with lead 2, a tape automated bonding (TAB) lead may be used to avoid the problem (see FIG. 5).

Second Embodiment

Figure 6:
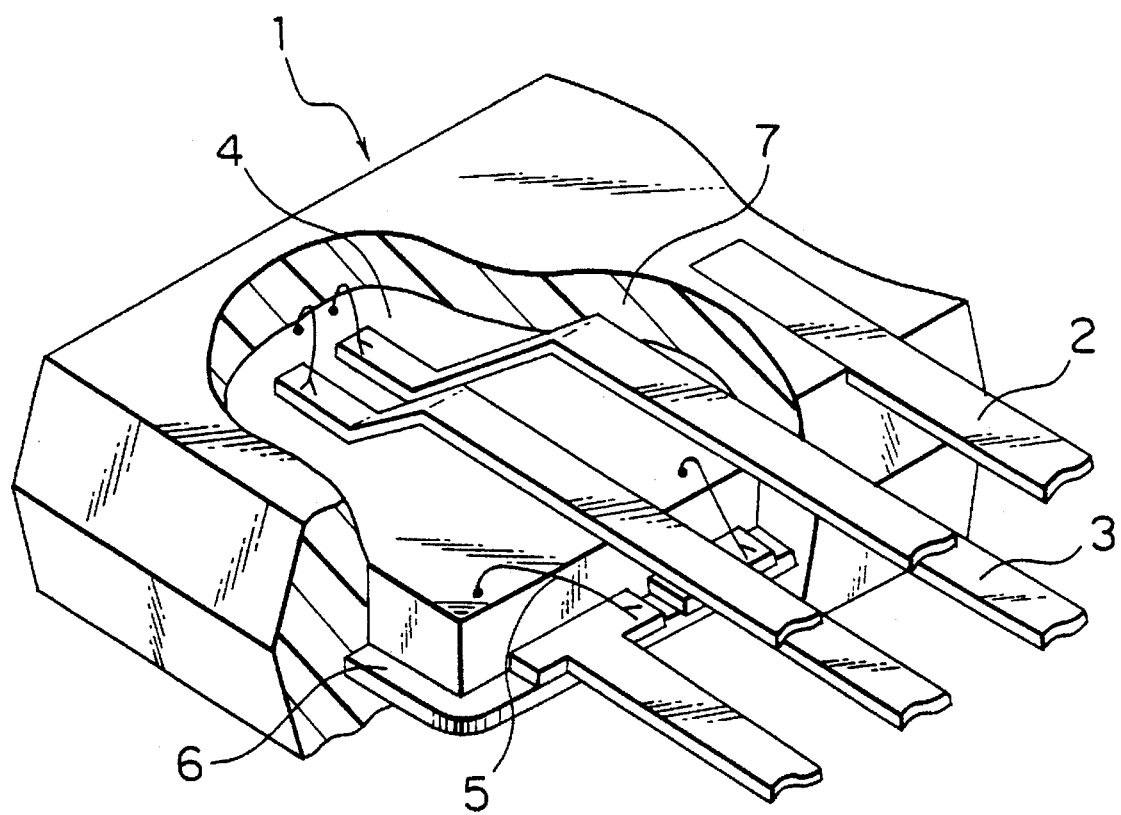
FIG. 6 is a partially cutaway perspective view of a semiconductor device according to a second embodiment of the invention.
Figure 7:
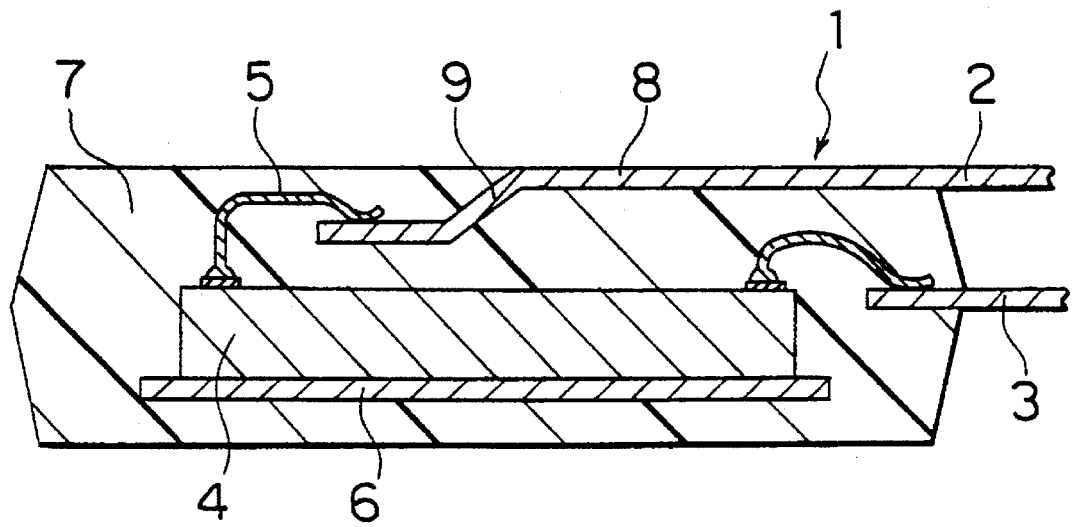
FIG. 7 is a cross sectional side view of the semiconductor device illustrated in FIG. 6.
Figure 8:
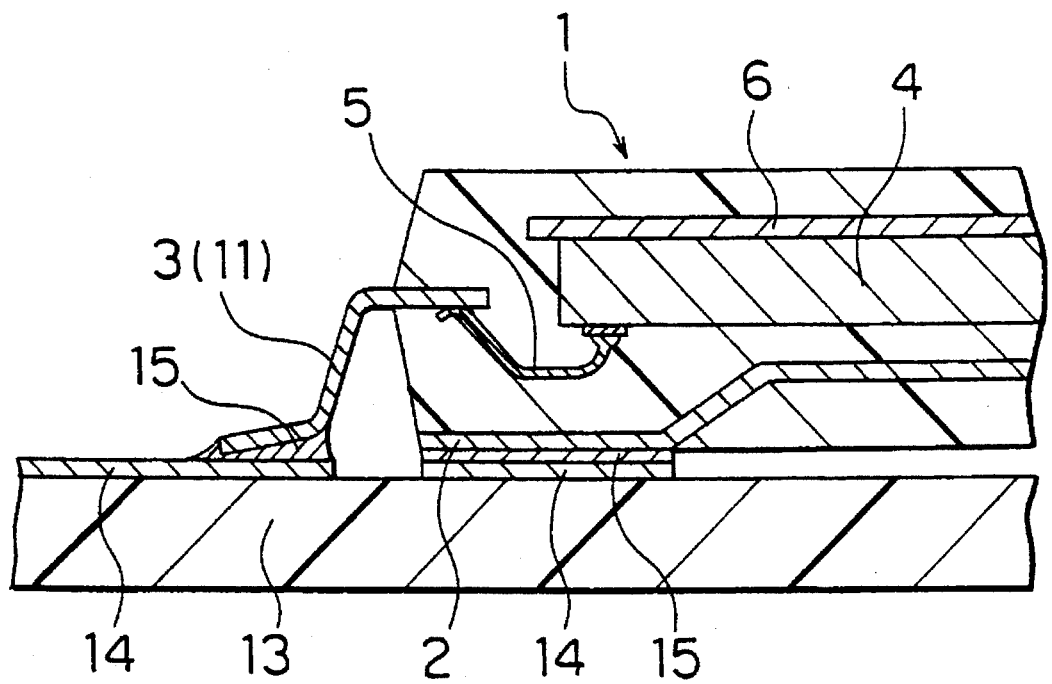
FIG. 8 is a partial cross sectional side view of a semiconductor device according to a second embodiment of the invention.

A second embodiment of a semiconductor device will be described below with reference to FIGS. 6 through 8. FIG. 6 is a partially cutaway perspective view of the semiconductor device as the second embodiment of the invention, while FIG. 7 is a side cross sectional view of FIG. 6. Referring to FIGS. 6–8, reference numeral 13 denotes a substrate to which is mounted semiconductor device 1; reference numeral 14 denotes a land which is a portion of the wiring on substrate 13 where lead 3 (outer lead 11) of semiconductor 1 is connected with solder 15.

As shown in FIGS. 6 and 7, the semiconductor device of the second embodiment has its inner lead 8 of the lead 2 forming a part of the first lead frame 1 exposed at the semiconductor device surface, which is achieved by adjusting how much the sunk portion 9 illustrated in FIG. 4 is bent downward and the thickness of the sealing resin 7 on the semiconductor chip 4. The inner lead 8 which is exposed at the surface of the semiconductor device allows heat to be radiated.

As shown in FIG. 8, mounting of lead 2 forming a part of the first lead frame is performed by cutting lead 2 at the edges of the semiconductor package and soldering lead 2 onto land 14 with solder 15. Lead 3 forming a part of the second lead frame is mounted by forming it, for example, into a gull-wing shaped lead and soldering this onto land 14 on substrate 13.

Third Embodiment

Figure 9:
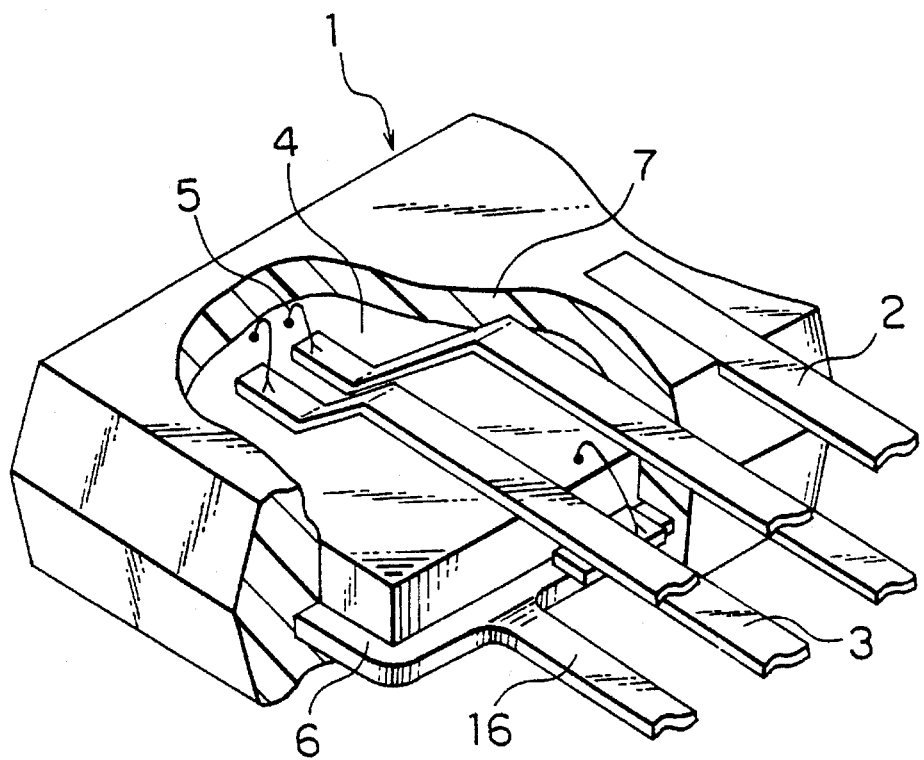
FIG. 9 is a partial cutaway perspective view of a semiconductor device according to a third embodiment of the invention.
Figure 10:
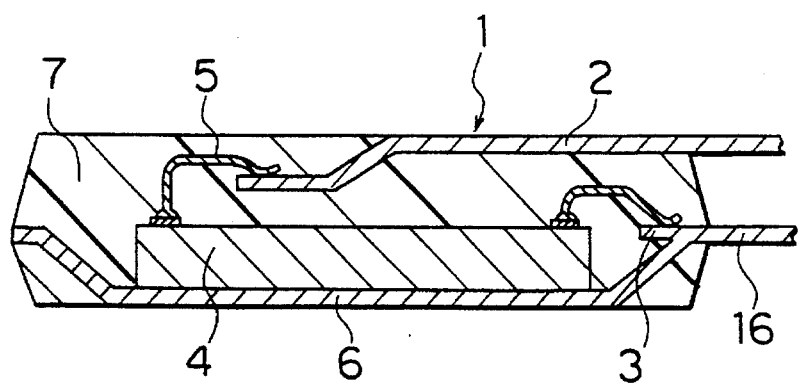
FIG. 10 is a cross sectional side view of the semiconductor device illustrated in FIG. 9.
Figure 11:
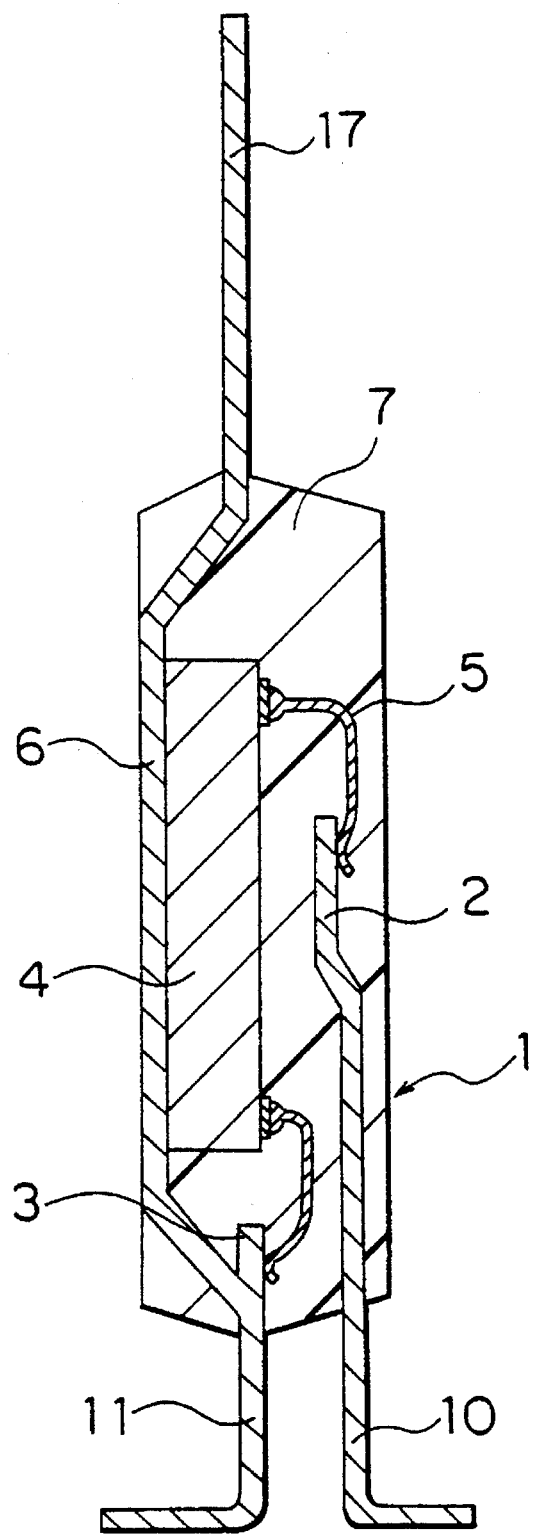
FIG. 11 is a cross sectional side view of a semiconductor device according to a third embodiment of the invention with a radiation fin.

A description will be given of a semiconductor as a third embodiment of the invention with reference to FIGS. 9 through 11. FIG. 9 is a partial cutaway perspective view of the semiconductor of the third embodiment of the invention, while FIG. 10 is a side cross sectional view of FIG. 9. Referring to FIGS. 9–11, reference numeral 16 denotes a suspension lead for connecting and fixing the die pad 6, having mounted and bonded thereon semiconductor chip 4, to a lead frame; and reference numeral 17 denotes a heat radiation fin.

As shown in FIGS. 9 and 10, the semiconductor device of the third embodiment of the invention has the die pad 6 in the semiconductor package at its back side, opposite to the surface where the semiconductor chip 4 and mounted, is partly exposed, which is achieved by adjusting the extent to which the sunk portion of the suspension lead 16 for fixing the die pad 6 is bent downward or by adjusting the thickness of sealing resin 7. This allows the semiconductor device to have better heat radiation capability.

As shown in FIG. 11, a portion of the second lead frame connected to the die pad may be made to extend out from the semiconductor package to form heat radiation fin 17. The heat radiation fin 17 allows the semiconductor device to have even better heat radiation capability.

Fourth Embodiment

Figure 12:
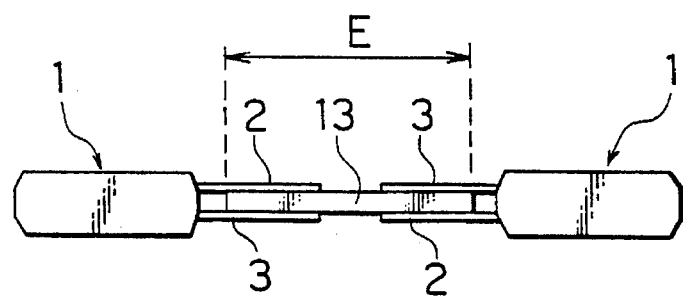
FIG. 12 is a side view of a semiconductor module according to a fourth embodiment of the invention.
Figure 13:
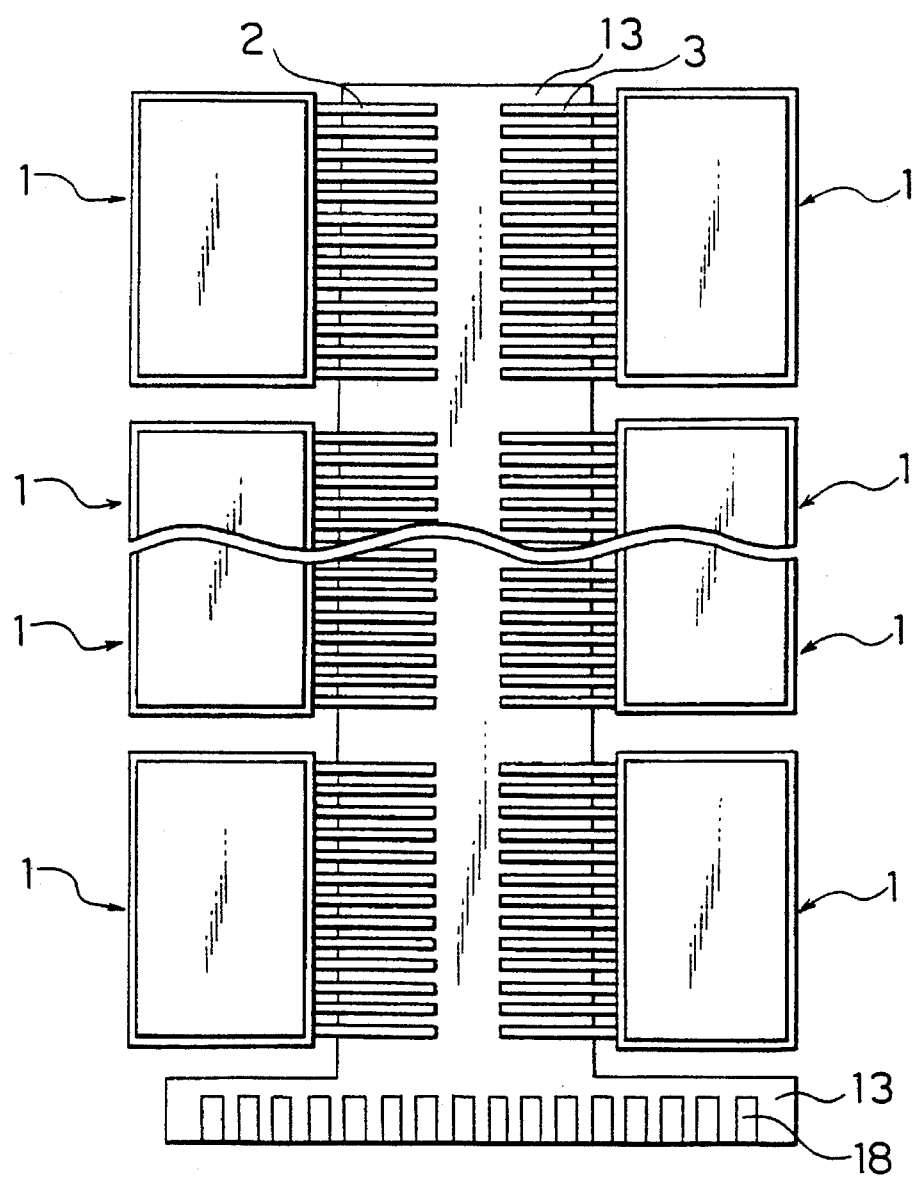
FIG. 13 is a plan view of the semiconductor module illustrated in FIG. 12.

A description will be made of a semiconductor module as a fourth embodiment of the invention. FIG. 12 is a side view of the semiconductor module of the fourth embodiment of the invention, while FIG. 13 is a plan view of FIG. 12. Referring to these figures, a large number of semiconductor devices 1 of the invention are mounted to substrate 13. This semiconductor module is used, for example, as a memory module. Reference numeral 18 denotes electrodes which are provided on substrate 13, which are used for electrical connection to a mother board (not illustrated).

As shown in FIGS. 12 and 13, in the semiconductor module of the fourth embodiment, semiconductor devices are mounted to substrate 13 by placing the substrate 13 between the outer leads, without bending the front ends of the outer leads 2 and 3. This allows a semiconductor module of an extremely small projected area to be produced.

However, when mounting such as that shown in FIG. 12 is performed, since the length E is short, it is difficult to use a large number of electrodes 18 to connect substrate 13 to the mother board. To solve this problem, as illustrated in FIG. 13, the substrate may be made wider only at the portion where electrodes 18 are provided to connect it with the mother board. This allows a large number of electrodes 18 to be used on the substrate 13.

Fifth Embodiment

Figure 14:
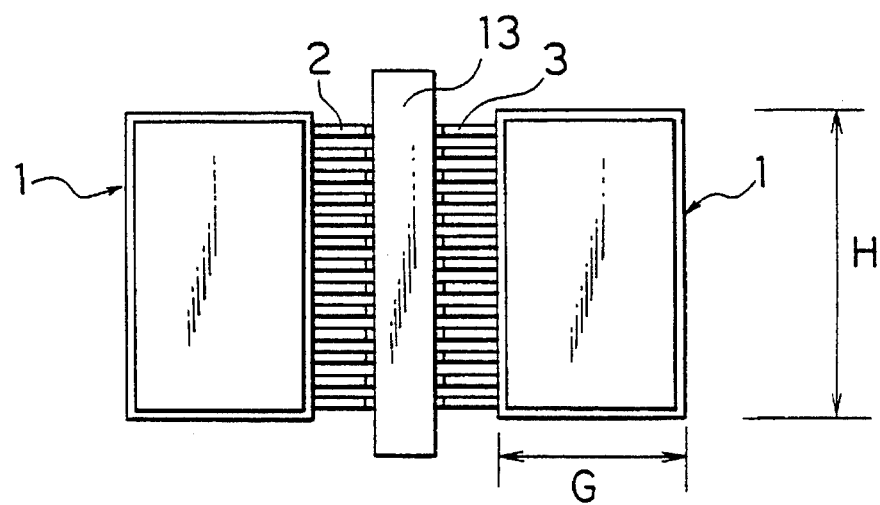
FIG. 14 is a side view of a semiconductor module according to a fifth embodiment of the invention.
Figure 15:
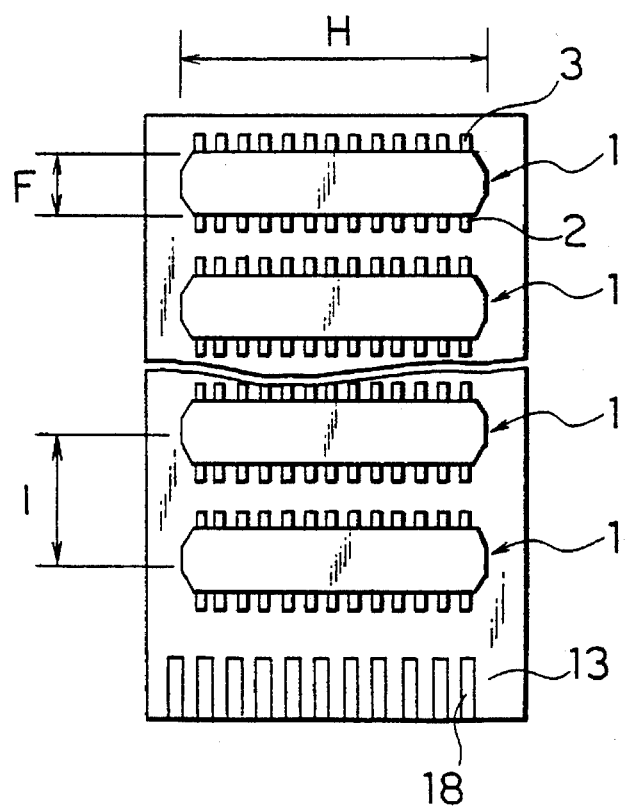
FIG. 15 is a plan view of the semiconductor module illustrated in FIG. 14.
Figure 16:
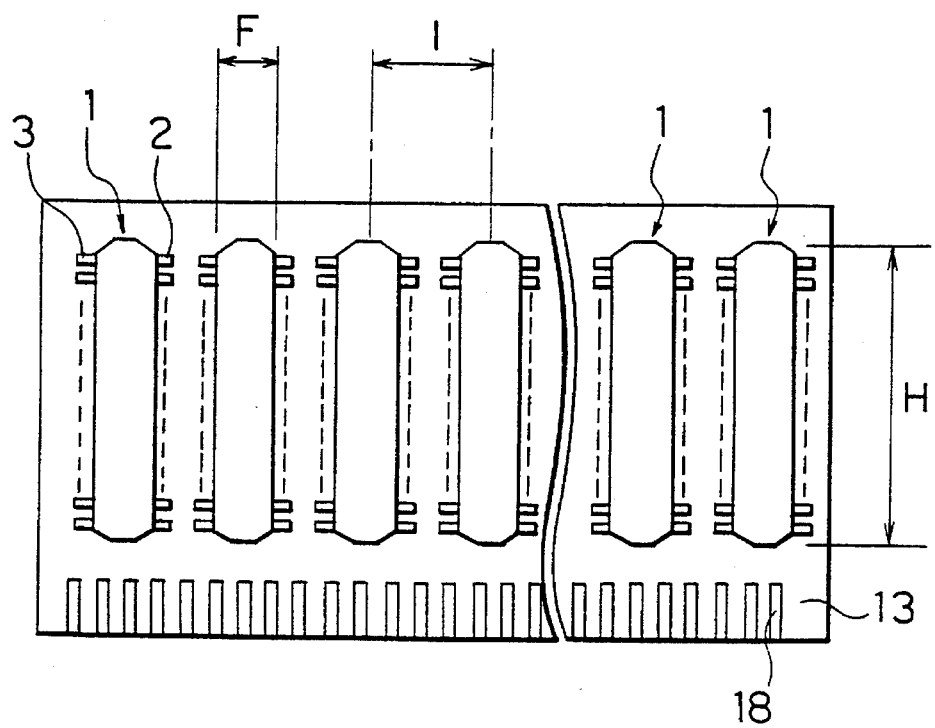
FIG. 16 is a plan view of another semiconductor module according to a fifth embodiment of the invention.

A description will be given of a semiconductor module as a fifth embodiment of the invention with reference to FIGS. 14 through 16. FIG. 14 is a side view of the semiconductor module of the fifth embodiment of the invention, while FIG. 15 is a plan view of FIG. 14. As shown in these figures, semiconductor device 1 is mounted perpendicular to and on both sides of the substrate 13. In addition, the semiconductor device 1 is mounted parallel to a side of the substrate which is connected to the mother board. This results in the area required to mount semiconductor modules to be reduced by more than one half compared to that required to mount the same number of TSOPs. For example, when four 16M DRAM second generation TSOPs [with a thickness F: 1 mm; package width (portion not including the projecting leads) G: 9.22 mm; package length (the side where the leads extend out) H: 17.14 mm] are mounted on one side of substrate 13, the substrate must have an area of at least (9.22×4)×17.14=632 mm².

On the other hand, in the embodiment of FIG. 15, when the package mounting pitch I is 2.54 mm, the area of the substrate is essentially (2.54×4)×17.14=174 mm², which is approximately 30% of the aforementioned area required conventionally. That is, the wiring length can be shortened in correspondence with the decreased area, so that a memory module suitable for high-speed operation can be obtained. In a semiconductor module which is mounted in a manner illustrated in FIGS. 14 and 15, the semiconductor devices 1 are mounted perpendicular to the substrate 13 in a fin-like arrangement, so that the semiconductor devices have better heat radiation capability compared to the TSOPs mounted in the usual manner.

However, as in the mounting of the module shown in the FIG. 12, when mounting the semiconductor module of FIG. 15, it may sometimes be difficult to use a large number of electrodes 18 for connecting the substrate 13 and the mother board. In this case, as shown in FIG. 16, mounting semiconductor devices 1 (and semiconductor chip 4 perpendicular to a side of substrate 13 connected to the mother board allows a larger number of electrodes 18 to be used. Such a method of mounting semiconductor devices is particularly effective when mounting a large number of semiconductor devices 1 to substrate 13. For example, when a second generation 16M DRAM is used, since the package length (the side where the leads extend out) H: 17.14 mm, in mounting more than seven semiconductor devices 1 at a mounting pitch I of 2.54 mm to one side of substrate 13, more electrodes 18 can be used in the mounting method of the embodiment.

Sixth Embodiment

Figure 17:
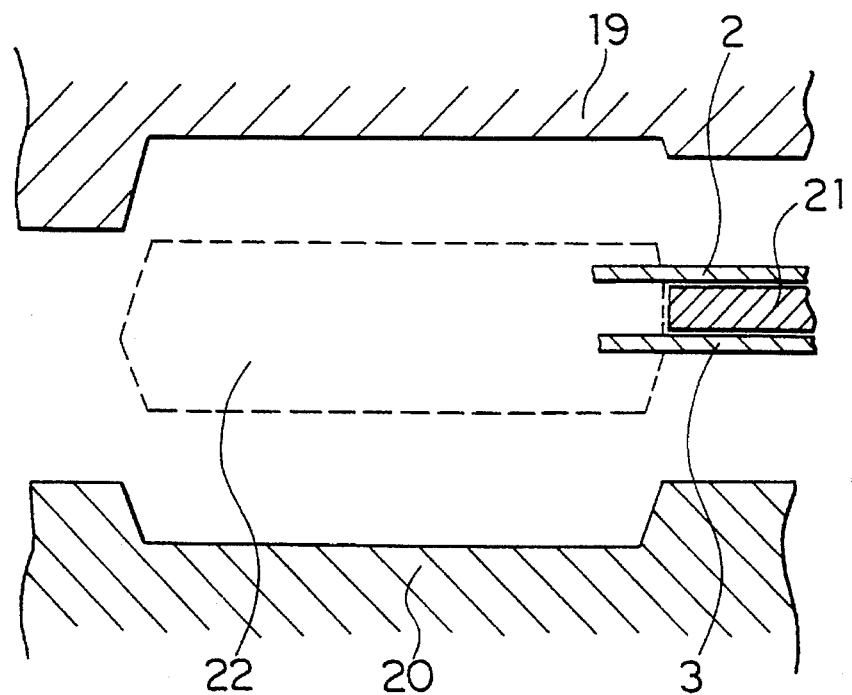
FIG. 17 is a schematic side view of a die used for producing a semiconductor device according to a sixth embodiment of the invention.
Figure 18:
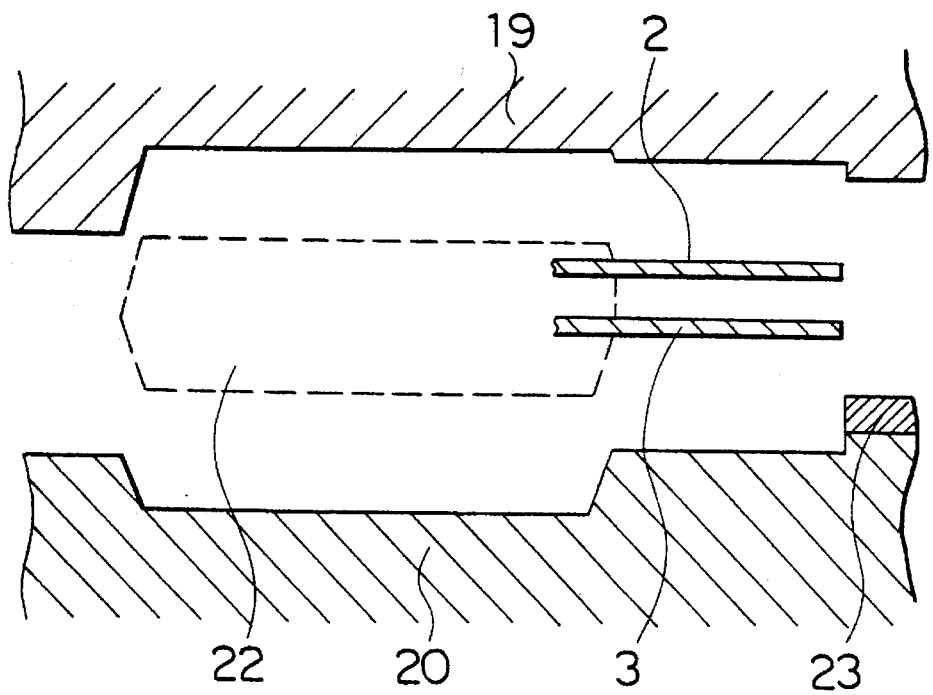
FIG. 18 is a schematic side view of the die having a moving block used in producing a semiconductor device according to the sixth embodiment of the invention.
Figure 19:
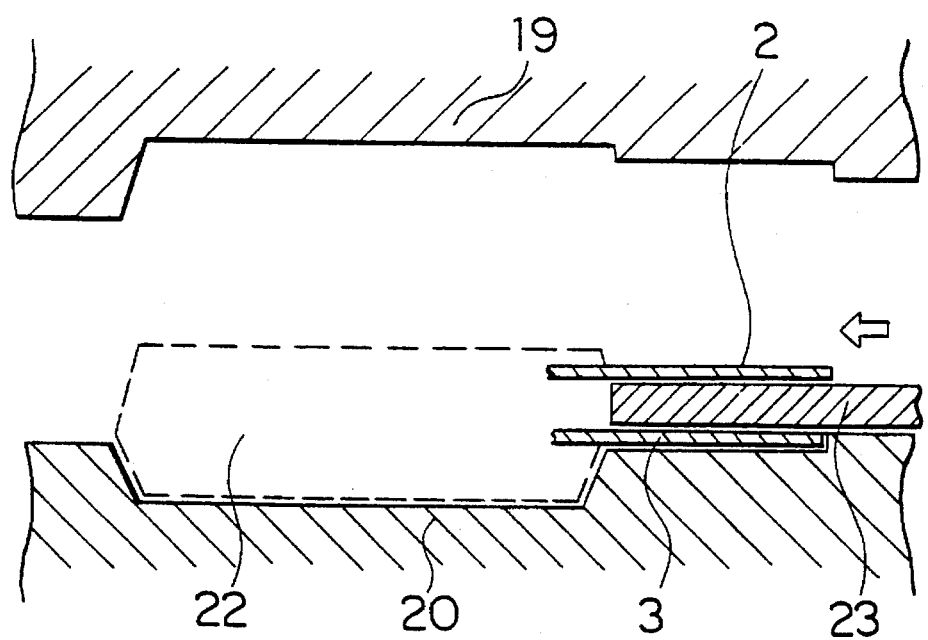
FIG. 19 is a schematic side view of the sixth embodiment of the invention with the moving block inserted between the outer leads.
Figure 20:
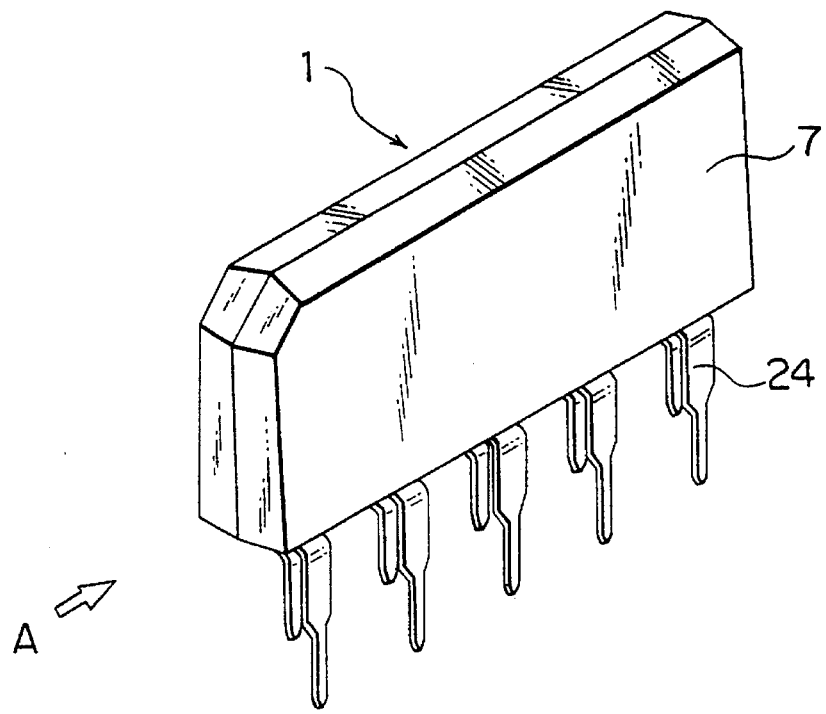
FIG. 20 is a perspective view of a conventional vertical-type THD package.
Figure 21:
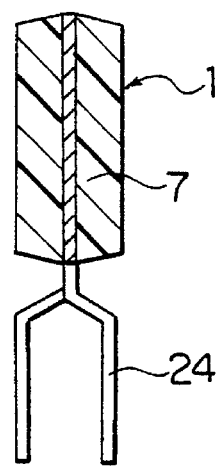
FIG. 21 is a cross sectional side view of the vertical-type THD package illustrated in FIG. 20.
Figure 22:
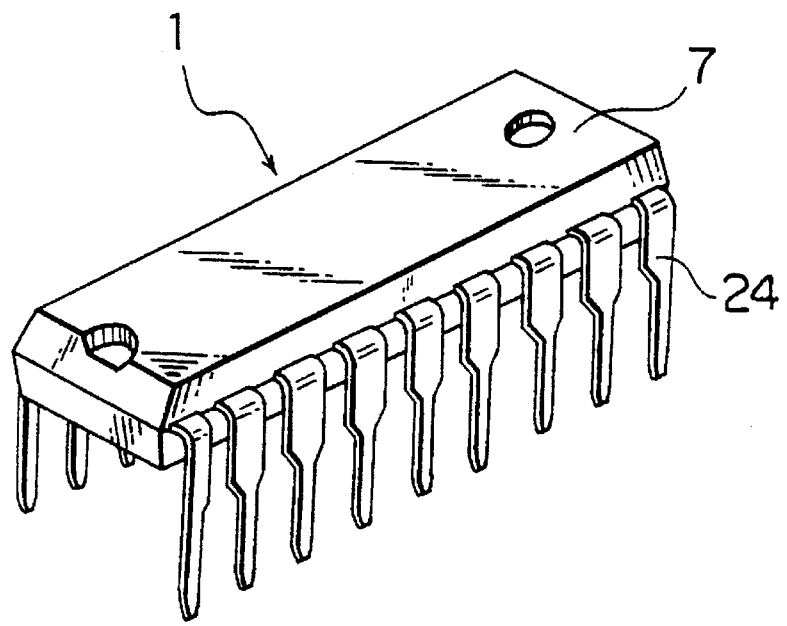
FIG. 22 is a perspective view of another conventional THD package.
Figure 23:
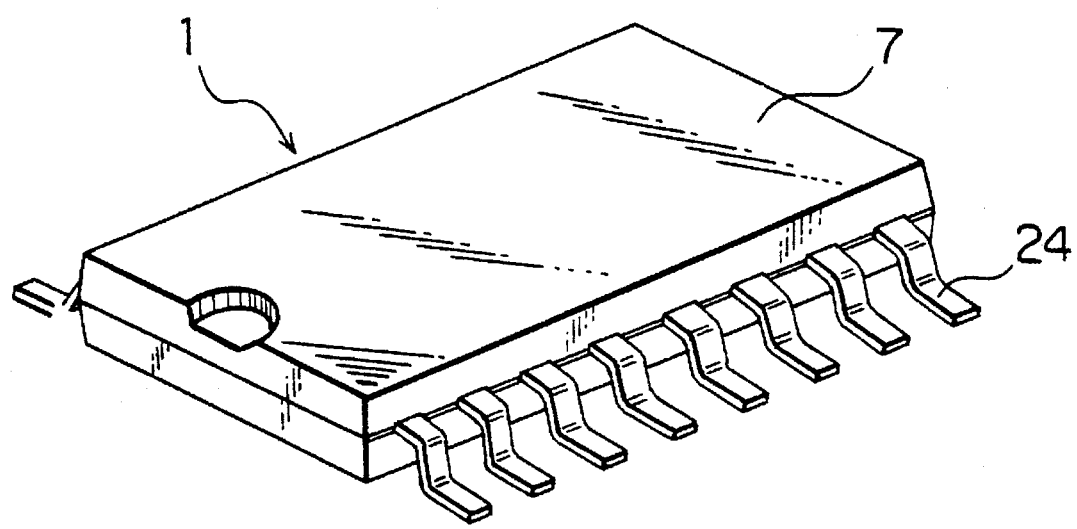
FIG. 23 is a perspective view of a conventional surface mount type package.
Figure 24:
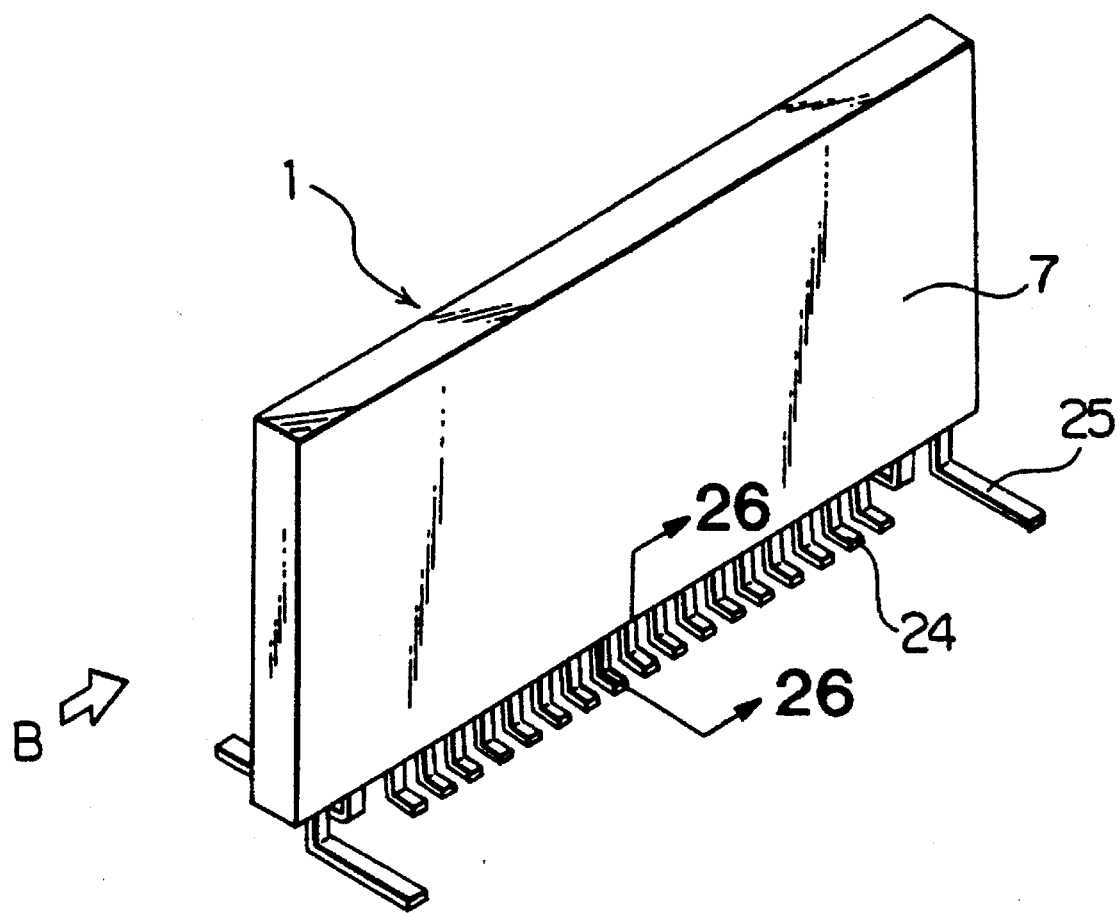
FIG. 24 is a perspective view of a conventional vertical surface mount type package.
Figure 25:
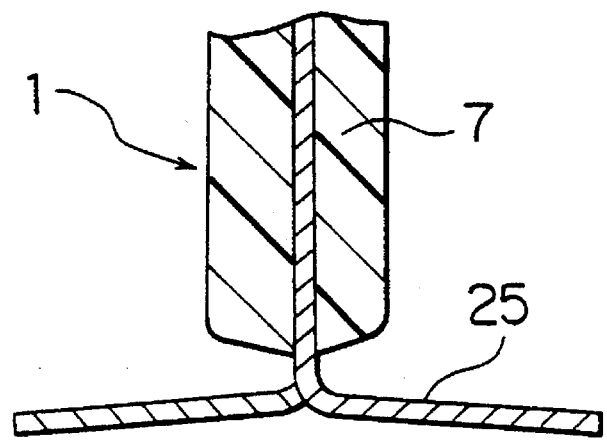
FIG. 25 is a partial cross sectional side view of the package illustrated in FIG. 24.
Figure 26:
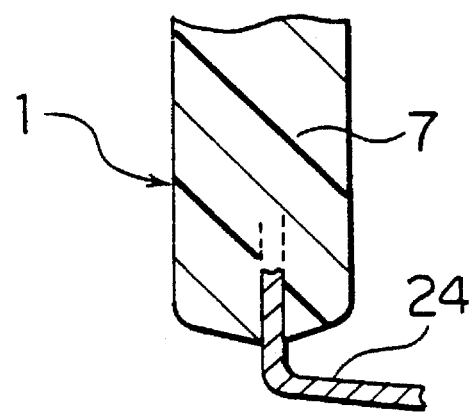
FIG. 26 is a partial cross sectional view of the package of FIG. 24 taken along line 26—16.
Figure 27:
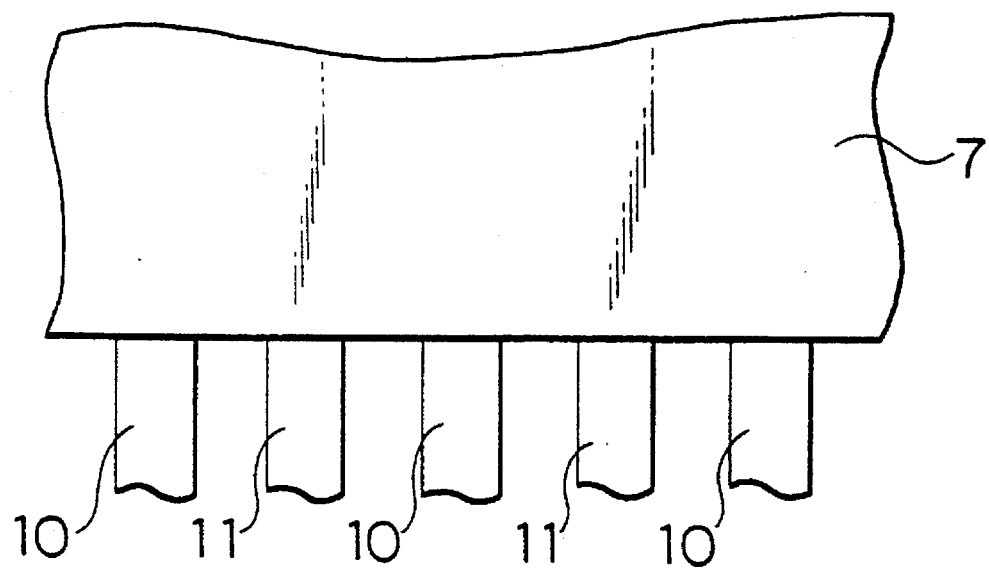
FIG. 27 is a partial plan view of a package which utilizes the conventional two-row outer lead arrangement.

A description will be given of a method of producing semiconductor devices as a sixth embodiment of the invention with reference to FIGS. 17 through 19. FIGS. 17 through 19 are each schematic side views of a die used for producing the semiconductor device as the sixth embodiment of the invention. Referring to these figures, reference numeral 19 denotes an upper die of the die used for resin sealing for producing semiconductor device 1; reference numeral 20 denotes a lower die; reference numeral 21 denotes a third die for preventing injection of resin between an outer lead of lead 2 forming a part of the first lead frame and an outer lead of lead 3 forming a part of the second lead frame; reference numeral 22 denotes a resin sealing portion of semiconductor 1; and reference numeral 23 denotes a moving block which is movably provided on a portion of the lower die 20.

In producing semiconductor device 1, before carrying out resin sealing with the upper die 19 and lower die 20, the first die 21 is interposed between two lead frames to prevent particularly injection of resin between the outer leads forming parts of the two lead frames. This prevents resin from being injected between the outer leads.

In FIGS. 18 and 19, in place of the aforementioned third die 21, moving block 23 is movably provided on lower die 20. After two lead frames have been set at the lower die 20, the moving block 23 is moved into the end of the resin sealing portion to prevent resin from being injected between the outer leads of the two lead frames. Then, upper die 19 and lower die 20 are fitted together to subject the resin sealing portion to resin sealing. In this case, too, resin can be prevented from being injected between the outer leads.

What is claimed is:

1. A semiconductor device including first and second lead frames having respective inner leads and outer leads, a semiconductor chip having electrodes on a functional face and electrically connected to respective inner leads of the first and second lead frames, a resin encapsulating the semiconductor chip and the inner leads, the outer leads projecting outwardly from a Side of the resin, wherein the inner leads of the first lead frame extend along and are spaced from the functional face of the semiconductor chip and are electrically connected to electrodes on the semiconductor chip remote from the side of the resin where the outer leads extend outwardly, inner leads of the second lead frame are electrically connected to electrodes on the semiconductor chip located proximate the side of the resin where the outer leads extend outwardly, the outer leads of the first and second lead frames are substantially parallel to each other and are disposed in different, respective planes and, in a geometric projection of the outer leads of the first lead frame on the plane containing the outer leads of the second lead frame, the outer leads of the first lead frame overlap portions of the outer leads of the second lead frame.

2. The semiconductor device according to claim 1 wherein the outer leads of the first and second lead frames are arranged in two rows and extend outwardly from the side of the resin, each of the outer leads of each row being bent by almost ninety degrees, opposing outer leads being bent in opposite directions.

3. The semiconductor device according to claim 1 wherein ends of inner leads of the first lead frame are bent toward the semiconductor chip.

4. The semiconductor device according to claim 1 including a TAB lead electrically connecting the inner leads of the second lead frame to electrodes on the semiconductor chip.

5. The semiconductor device according to claim 1 wherein the inner leads of the first lead frame are exposed at a surface of the resin at the functional face of the semiconductor chip.

6. The semiconductor device according to claim 1 including a die pad on which the semiconductor chip is mounted wherein the inner leads of the second lead frame are connected to the die pad and wherein the die pad has a back side, opposite a front side where the semiconductor chip is mounted, partly exposed at a surface of the resin.

7. The semiconductor device according to claim 1 wherein a portion of the second lead frame extends outwardly from the semiconductor device as a heat radiation fin.

8. The semiconductor device according to claim 1 wherein the outer leads of the first and second lead frames are arranged in two rows and extend outwardly from only one side of the resin.

9. A semiconductor module including a planar substrate and a plurality of semiconductor devices mounted on the substrate wherein outer leads, which are arranged in two rows that extend outwardly and almost parallel to one another from a side of the semiconductor device, and straddle the substrate so that the semiconductor device is mounted to the substrate in almost the plane of the substrate and wherein each semiconductor device includes:

first and second lead frames having respective inner leads and outer leads, a semiconductor chip having electrodes electrically connected to respective inner leads of the first and second lead frames, and a resin encapsulating the semiconductor chip and the inner leads, the outer leads projecting outwardly from the resin, wherein the outer leads of the first and second lead frames are substantially parallel to each other and are disposed in different, respective planes and, in a geometric projection of the outer leads of the first lead frame on the plane containing the outer leads of the second lead frame, the outer leads of the first lead frame overlap portions of the outer leads of the second lead frame.

10. The semiconductor device according to claim 9 wherein a portion of the substrate including electrodes for electrical connection to a mother board is wider than parts of the substrate where the plurality of semiconductor devices is mounted.

11. A semiconductor module including a substrate and a plurality of semiconductor devices mounted on the substrate wherein the semiconductor devices are arranged parallel to one another on at least one surface of the substrate, the substrate includes electrodes transverse to the plurality of semiconductor devices for connection to a mother board, and each semiconductor device includes:

first and second lead frames having respective inner leads and outer leads, a semiconductor chip having electrodes electrically connected to respective inner leads of the first and second lead frames, and a resin encapsulating the semiconductor chip and the inner leads, the outer leads projecting outwardly from the resin, wherein the outer leads of the first and second lead frames are substantially parallel to each other and are disposed in different, respective planes and, in a geometric projection of the outer leads of the first lead frame on the plane containing the outer leads of the second lead frame, the outer leads of the first lead frame overlap portions of the outer leads of the second lead frame.

12. A semiconductor module including a substrate and a plurality of semiconductor devices mounted on the substrate wherein the semiconductor devices are arranged parallel to one another on at least one surface of the substrate, the substrate includes electrodes parallel to the plurality of semiconductor devices for connection to a mother board and each semiconductor device includes:

first and second lead frames having respective inner leads and outer leads, a semiconductor chip having electrodes electrically connected to respective inner leads of the first and second lead frames, and a resin encapsulating the semiconductor chip and the inner leads, the outer leads projecting outwardly from the resin, wherein the outer leads of the first and second lead frames are substantially parallel to each other and are disposed in different, respective planes and, in a geometric projection of the outer leads of the first lead frame on the plane containing the outer leads of the second lead frame, the outer leads of the first lead frame overlap portions of the outer leads of the second lead frame.

* * * * *